United States Patent
Ishida et al.

(10) Patent No.: US 11,114,386 B2
(45) Date of Patent: Sep. 7, 2021

(54) SEMICONDUCTOR DEVICE AND METHOD OF MANUFACTURING THE SAME

(71) Applicant: Mitsubishi Electric Corporation, Tokyo (JP)

(72) Inventors: Kiyoshi Ishida, Tokyo (JP); Hidenori Ishibashi, Tokyo (JP); Makoto Kimura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/491,620

(22) PCT Filed: Apr. 19, 2018

(86) PCT No.: PCT/JP2018/016091
§ 371 (c)(1),
(2) Date: Sep. 6, 2019

(87) PCT Pub. No.: WO2018/207583
PCT Pub. Date: Nov. 15, 2018

(65) Prior Publication Data
US 2020/0058598 A1    Feb. 20, 2020

(30) Foreign Application Priority Data
May 9, 2017 (JP) .............................. JP2017-093199

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4828* (2013.01); *H01L 21/56* (2013.01);
(Continued)

(58) Field of Classification Search
CPC .................................................... H01L 23/552
See application file for complete search history.

(56) References Cited

U.S. PATENT DOCUMENTS

| 2007/0001275 A1 | 1/2007 | Shirasaka et al. |
| 2012/0241922 A1 | 9/2012 | Pagaila |

(Continued)

FOREIGN PATENT DOCUMENTS

| JP | 2003218284 A | 7/2003 |
| JP | 2006319014 A | 11/2006 |

(Continued)

OTHER PUBLICATIONS

EPO machine translation of JP 2007-208283 (Year: 2007).*
(Continued)

*Primary Examiner* — Christopher A Johnson
(74) *Attorney, Agent, or Firm* — Buchanan Ingersoll & Rooney PC

(57) ABSTRACT

A semiconductor device includes a single lead frame, a semiconductor element, and a mold material. The semiconductor element is joined onto one main surface of the lead frame. The lead frame includes a die-attach portion, a signal terminal portion, and a ground terminal portion. The die-attach portion, the signal terminal portion, and the ground terminal portion are disposed directly below the mold material so as to be arranged in a direction along one main surface. A groove portion is provided by partially removing the lead frame so as to allow the groove portion to pass therethrough, the groove portion being provided between the die-attach portion and the ground terminal portion adjacent to each other in the lead frame and between the signal terminal portion and the ground terminal portion adjacent to each other in the lead frame.

11 Claims, 9 Drawing Sheets

(51) Int. Cl.
  *H01L 21/56* (2006.01)
  *H01L 23/495* (2006.01)
  *H01L 23/00* (2006.01)

(52) U.S. Cl.
  CPC .. *H01L 23/49548* (2013.01); *H01L 23/49586* (2013.01); *H01L 24/73* (2013.01); *H01L 21/4842* (2013.01); *H01L 23/49513* (2013.01); *H01L 2224/73265* (2013.01)

(56) References Cited

U.S. PATENT DOCUMENTS

2013/0314879 A1* 11/2013 Yin ................... H01L 23/49861
 361/728
2017/0330838 A1* 11/2017 Mizutani ................. H01L 24/97

FOREIGN PATENT DOCUMENTS

| | | |
|---|---|---|
| JP | 2007208283 A | 8/2007 |
| JP | 2010040854 A | 2/2010 |
| WO | 2016092633 A1 | 6/2016 |

OTHER PUBLICATIONS

Extended European Search Report dated Mar. 4, 2020 for corresponding European patent application No. 18797540.4, 11 pages.
International Search Report (PCT/ISA/210) dated Jun. 19, 2018, by the Japan Patent Office as the International Searching Authority for International Application No. PCT/JP2018/016091.
Written Opinion (PCT/ISA/237) dated Jun. 19, 2018, by the Japan Patent Office as the International Searching Authority for International Application No. PCT/JP2018/016091.

* cited by examiner

SEMICONDUCTOR DEVICE AND METHOD OF MANUFACTURING THE SAME

TECHNICAL FIELD

The present invention relates to a semiconductor device and a method of manufacturing the semiconductor device, and particularly to a semiconductor device in which a semiconductor element having a high frequency circuit formed thereon is housed, and a method of manufacturing the semiconductor device.

BACKGROUND ART

In a semiconductor device in which a semiconductor element having a high frequency circuit formed thereon is housed, a metal cover is provided over the semiconductor device for the purpose of suppressing radiation of electromagnetic waves to the outside of the semiconductor device, and for the purpose of blocking the electromagnetic waves applied from outside, for example, as disclosed in Japanese Patent Laying-Open No. 2006-319014 (PTL 1). Japanese Patent Laying-Open No. 2006-319014 discloses a double-sided mold package using a lead frame. The package includes an outer lead, and is configured such that a metal case as a metal cover is attached to each of the upper side and the lower side of a mold portion.

Furthermore, for example, Japanese Patent Laying-Open No. 2010-40854 (PTL 2) discloses a configuration in which two lead frames are overlaid on one another and fixed to each other, and one grounded lead frame of these two lead frames entirely surrounds the entire circumference of the lead terminal of the other lead frame. Thereby, one lead frame is allowed to block a leakage signal generated from the lead terminal of the other lead frame and an unnecessary signal from outside.

CITATION LIST

Patent Literature

PTL 1: Japanese Patent Laying-Open No. 2006-319014
PTL 2: Japanese Patent Laying-Open No. 2010-40854

SUMMARY OF INVENTION

Technical Problem

In order to facilitate fabrication of high-frequency applicable equipment formed by mounting the semiconductor device thereon, a semiconductor device allowing fabrication of high-frequency applicable equipment by a surface mount technology is required. Also, a mounting area occupied by a semiconductor device is required to be reduced in order to downsize high-frequency applicable equipment.

The semiconductor device disclosed in Japanese Patent Laying-Open No. 2006-319014 has a metal case for electromagnetic shielding. This metal case has a side surface from which an outer lead protrudes. Accordingly, the mounting area occupied by the entire semiconductor device is increased by an area corresponding to this protruding outer lead. Also, since the outer lead protrudes to the outside from the metal case, the signal terminal of the protruding portion cannot be electromagnetically shielded.

On the other hand, the semiconductor device disclosed in Japanese Patent Laying-Open No. 2010-40854 is configured not to have an outer lead structure but to have a bottom surface electrode structure in which a terminal is placed on a bottom surface. However, in Japanese Patent Laying-Open No. 2010-40854, a fitted region is required for assembling two lead frames. Also, after two lead frames are fitted to each other so as to be assembled, the fitted region is eventually removed. Accordingly, the utilization efficiency of the entire lead frame material is decreased.

The present invention has been made in light of the above-described problems. An object of the present invention is to provide a semiconductor device having a reduced mounting area and achieving higher utilization efficiency of the entire lead frame material, and a method of manufacturing the semiconductor device.

Solution to Problem

A semiconductor device of the present invention includes a single lead frame, a semiconductor element, and a mold material. The semiconductor element is joined onto one main surface of the lead frame. The mold material covers the one main surface of the lead frame and seals the semiconductor element. The lead frame includes a die-attach portion, a signal terminal portion, and a ground terminal portion. The die-attach portion, the signal terminal portion and the ground terminal portion are disposed directly below the mold material so as to be arranged in a direction along the one main surface. The lead frame is provided with a groove portion by partially removing the lead frame so as to allow the groove portion to pass through the lead frame. The groove portion is provided between the die-attach portion and the ground terminal portion that are adjacent to each other and between the signal terminal portion and the ground terminal portion that are adjacent to each other.

A method of manufacturing a semiconductor device of the present invention includes preparing a single lead frame. A groove portion is provided by partially removing the lead frame so as to allow the groove portion to pass through the lead frame. The groove portion is provided between the die-attach portion and the ground terminal portion that are adjacent to each other and between the signal terminal portion and the ground terminal portion that are adjacent to each other. By a mold material, one main surface of the lead frame is covered and the semiconductor element is sealed. The mold material is supplied so as to be overlaid directly above the die-attach portion, the signal terminal portion and the ground terminal portion. The ground terminal portion is disposed on an outer circumferential portion of the mold material in a plan view.

Advantageous Effects of Invention

According to the present invention, each of the terminals of the lead frame is disposed on a region overlapping with the mold material in a plan view, and does not extend to the outside thereof, with the result that the area occupied by the entire components is reduced. Also, each of the terminals is formed of a single lead frame, which eliminates the need to assemble two lead frames, with the result that the utilization efficiency of the entire lead frame material is enhanced.

DESCRIPTION OF EMBODIMENTS

In the following, an embodiment will be described with reference to the accompanying drawings.

First Embodiment

Figure 1:
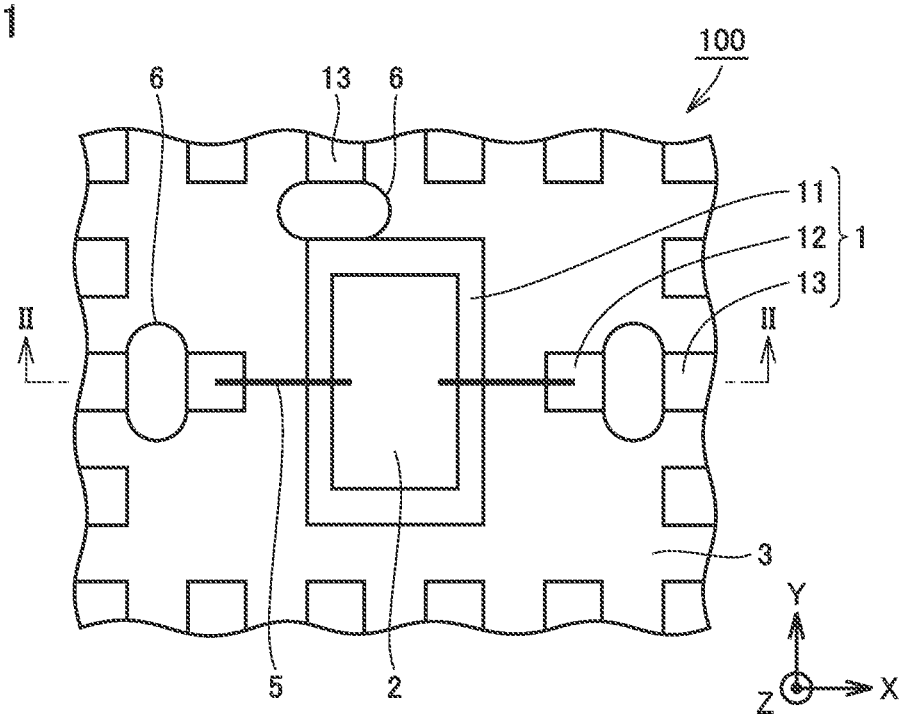
FIG. 1 is a schematic plan view of a semiconductor device according to the first embodiment.
Figure 2:
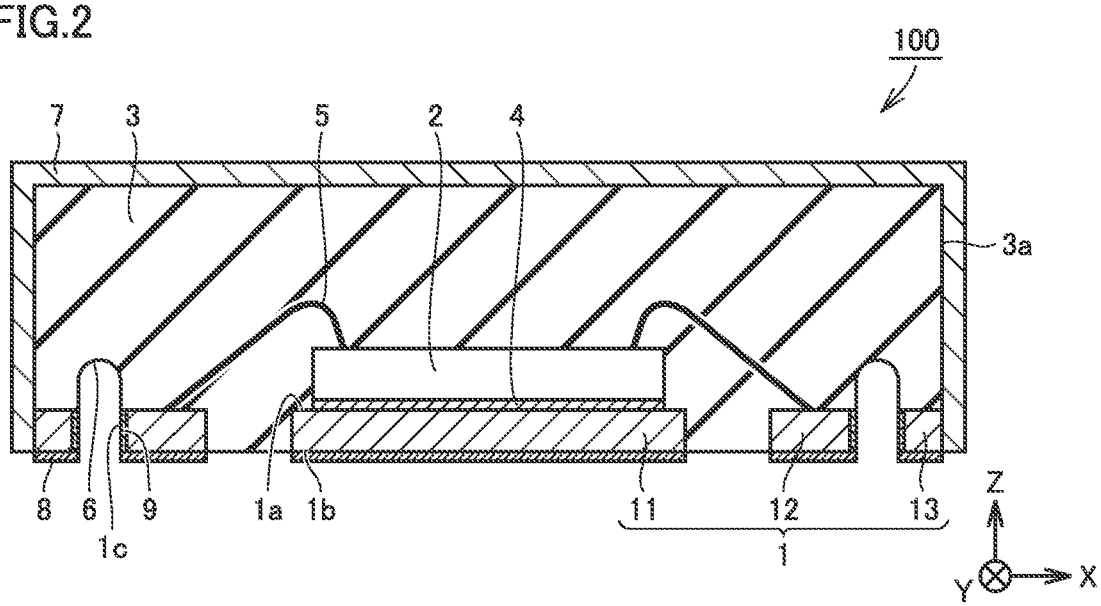
FIG. 2 is a schematic cross-sectional view of the semiconductor device according to the first embodiment.

First, the configuration of a semiconductor device according to the present embodiment will be hereinafter described with reference to FIGS. 1 and 2. FIG. 1 is a schematic plan view of a semiconductor device according to the present embodiment. FIG. 2 is a schematic cross-sectional view of a portion of the semiconductor device according to the present embodiment, which is particularly taken along a line II-II in FIG. 1. It is to be noted that some of regions such as an electrically conductive material shown in FIG. 2 are not shown in FIG. 1. In each of the figures, an X direction, a Y direction and a Z direction are employed for convenience of explanation. Referring to FIGS. 1 and 2, a semiconductor device 100 according to the present embodiment mainly includes: a lead frame 1; a semiconductor element 2; and a mold material 3 as a plastic mold material.

Lead frame 1 is formed as a base platform for the entire semiconductor device 100, provided as a flat plate-shaped member on which other members are placed, and preferably made of copper, for example. Alternatively, lead frame 1 may be made of an alloy of iron and nickel. Lead frame 1 includes, for example, one main surface 1a on the upper side in the Z direction and the other main surface 1b on the opposite side of one main surface 1a, that is, on the lower side in the Z direction. As shown in FIG. 1, one semiconductor device 100 basically includes only a single lead frame 1.

Furthermore, lead frame 1 includes a die-attach portion 11, a signal terminal portion 12, and a ground terminal portion 13. Die-attach portion 11 serves as a region on which semiconductor element 2 is placed so as to be joined thereto. Conversely, semiconductor element 2 is joined onto a part on one main surface 1a of lead frame 1, particularly onto one main surface 1a of die-attach portion 11. Die-attach portion 11 and semiconductor element 2 are joined to each other with a joining material 4 interposed therebetween. It is preferable that joining material 4 is for example made of a solder material selected from the group consisting of: gold-tin alloy solder; lead-tin alloy solder; tin-silver-copper alloy solder; gold-germanium alloy solder; and gold-silicon alloy solder. Alternatively, joining material 4 may be any one selected from the group consisting of: sintered gold paste formed of gold powder particles each having a particle size less than 1 µm; sintered silver paste formed of silver powder particles each having a particle size equal to or greater than 1 nm and equal to or less than 10 nm, for example; and sintered copper paste formed of copper fine powder particles each having a surface subjected to a rust preventive process. Furthermore, joining material 4 may be made of an electrically conductive silver paste formed of silver powder particles each having a particle size equal to or greater than 1 µm and equal to or less than 100 µm, for example.

Signal terminal portion 12 is electrically joined through a thin metal wire 5 to semiconductor element 2 that is joined to die-attach portion 11. Signal terminal portion 12 also allows electrical connection to the outside of semiconductor device 100. It is preferable that thin metal wire 5 is any one selected from the group consisting of a gold wire, a silver wire and a copper wire, each of which has a cross section intersecting with the extending direction of thin metal wire 5 and having a diameter of 10 µm or more and 50 µm or less.

Ground terminal portion 13 is provided as a terminal connected to a ground potential (not shown). Basically, die-attach portion 11, signal terminal portion 12 and ground terminal portion 13 are disposed so as to be arranged in the direction (for example, the X direction) along one main surface 1a of lead frame 1, but the order of arrangement thereof is not particularly limited. Also, each of die-attach portion 11, signal terminal portion 12 and ground terminal portion 13 may be provided in any number, and may be disposed at any position. However, as shown in FIGS. 1 and 2, it is preferable that die-attach portion 11, signal terminal portion 12 and ground terminal portion 13 are disposed so as to be arranged in this order, for example, in the X direction from the inside to the outside in a plan view. In FIG. 1, die-attach portion 11, signal terminal portion 12 and ground terminal portion 13 are arranged in this order from the inside to the outside in the X direction. In other words, signal terminal portion 12 is disposed on the outside of die-attach portion 11, and ground terminal portion 13 is disposed on the outside of signal terminal portion 12. Also in FIG. 1, die-attach portion 11 and ground terminal portion 13 are arranged in this order from the inside to the outside in the Y direction.

It is to be noted that ground terminal portion 13 is disposed on the outer circumferential portion of mold material 3 in a plan view, irrespective of the above-described arrangement of die-attach portion 11, signal terminal portion 12 and ground terminal portion 13. Specifically, ground terminal portion 13 is disposed on the outside of die-attach portion 11 and signal terminal portion 12 in semiconductor device 100 in a plan view. Furthermore, ground terminal portion 13 is disposed so as to surround signal terminal portion 12. Lead frame 1 has a schematic configuration as described above.

Semiconductor element 2 is provided as a chip-shaped member made of any material selected from the group consisting of: silicon; silicon germanium; gallium arsenide; gallium nitride; and silicon carbide, for example. On the above-mentioned chip-shaped member of semiconductor element 2, a transistor, a circuit wiring interconnection and the like are integrated using the semiconductor wafer process technique.

Mold material 3 is a member that covers one main surface 1a of lead frame 1 and seals semiconductor element 2. In other words, mold material 3 is disposed so as to cover and surround lead frame 1, semiconductor element 2 and thin metal wire 5 from above in the Z direction. Also in other words, die-attach portion 11, signal terminal portion 12 and ground terminal portion 13 are disposed directly below mold material 3 (below in the Z direction) so as to be arranged in the direction along one main surface 1a of lead frame 1.

It is preferable that mold material 3 is made of a material obtained by adding an inorganic filler such as spherical silica or pulverized silica to a thermosetting resin material such as an epoxy resin. By addition of an inorganic filler, the value of the coefficient of linear expansion of mold material 3 and the value of the coefficient of linear expansion of lead frame 1 can be brought closer to each other, which can reduce the deformation and the internal stress that occur when an environmental temperature changes.

Lead frame 1 is provided with a groove portion 6 between die-attach portion 11 and ground terminal portion 13 that are adjacent to each other, and also between signal terminal portion 12 and ground terminal portion 13 that are adjacent to each other. In other words, groove portion 6 is provided between ground terminal portion 13 and one of die-attach portion 11 and signal terminal portion 12 that are adjacent to ground terminal portion 13. Groove portion 6 is provided as a region extending in the Z direction, which is provided by partially removing lead frame 1 so as to allow groove portion 6 to pass through lead frame 1 in the Z direction. As shown in FIG. 2, groove portion 6 passes through lead frame 1 from the other main surface 1b thereof so as to reach one main surface 1a, and extends therefrom further upward in the Z direction. Thereby, groove portion 6 extends upward in the Z direction so as to reach the inside of mold material 3 that is in contact with the upper side of lead frame 1 in the Z direction in an overlapping manner.

In addition, semiconductor device 100 according to the present embodiment includes an electrically conductive material 7, a coating film 8, and an oxide film 9. Electrically conductive material 7 is formed on the outside of mold material 3 so as to cover at least a part of mold material 3. In FIG. 2, electrically conductive material 7 is provided as a thin film formed so as to cover the upper surface of mold material 3 that faces upward in the Z direction and to cover almost the entire surface of each of the side surfaces of mold material 3 that face in the X direction (and in the Y direction, though not shown).

As described above, in lead frame 1, ground terminal portion 13 is disposed on the outside of die-attach portion 11 and signal terminal portion 12 in a plan view, and also disposed on the outer circumferential portion of mold material 3 in a plan view. Accordingly, the thin film of electrically conductive material 7 that covers the outermost surface of mold material 3 in the X direction and the Y direction is in contact with at least the side surface (the first side surface) of ground terminal portion 13 disposed on the outer circumferential portion of mold material 3 in a plan view. In this case, the first side surface of ground terminal portion 13 faces in the X direction or the Y direction. Thus, the thin film of electrically conductive material 7 is in contact with the surface of ground terminal portion 13 of lead frame 1 that extends in the Z direction corresponding to the thickness direction of ground terminal portion 13. For the purpose of allowing connection to electrically conductive material 7, ground terminal portion 13 of lead frame 1 is disposed so as to include at least a part of the outermost circumference of mold material 3 in a plan view.

It is preferable that electrically conductive material 7 is formed of any one selected from the group consisting of: a thin metal film made of a copper alloy, a nickel alloy or the like; a thin film of an electrically conductive adhesive made of a silver paste or the like; and a plating film made of a copper alloy, a nickel alloy or the like.

Coating film 8 is provided as a thin film formed on the other main surface 1b of each of die-attach portion 11, signal terminal portion 12 and ground terminal portion 13 in lead frame 1. Coating film 8 is basically formed for rust prevention of lead frame 1. Coating film 8 is any one selected from the group consisting of: a rust preventive film made of imidazole or the like; an electroless nickel plating film; an electroless nickel-gold plating film formed by layers of an electroless nickel plating film and an electroless gold plating film; and an electroless nickel-palladium-gold plating film formed by layers of an electroless nickel plating film, an electroless palladium plating film and an electroless gold plating film. Thereby, die-attach portion 11, signal terminal portion 12 and ground terminal portion 13 in lead frame 1 can be protected from the other main surface 1b side.

Oxide film 9 is provided as a thin film formed on a side surface 1c (the second side surface) along which each of die-attach portion 11, signal terminal portion 12 and ground terminal portion 13 of lead frame 1 adjoins to groove portion 6. In other words, groove portion 6 of lead frame 1 has side surface 1c adjoining to each of die-attach portion 11, signal terminal portion 12 and ground terminal portion 13, and a fine oxide film is formed on this side surface 1c.

Then, a method of manufacturing a semiconductor device according to the present embodiment will be described with reference to the flowchart in FIG. 3 and the schematic diagrams in FIGS. 4 to 11 and FIG. 2.

Figure 3:
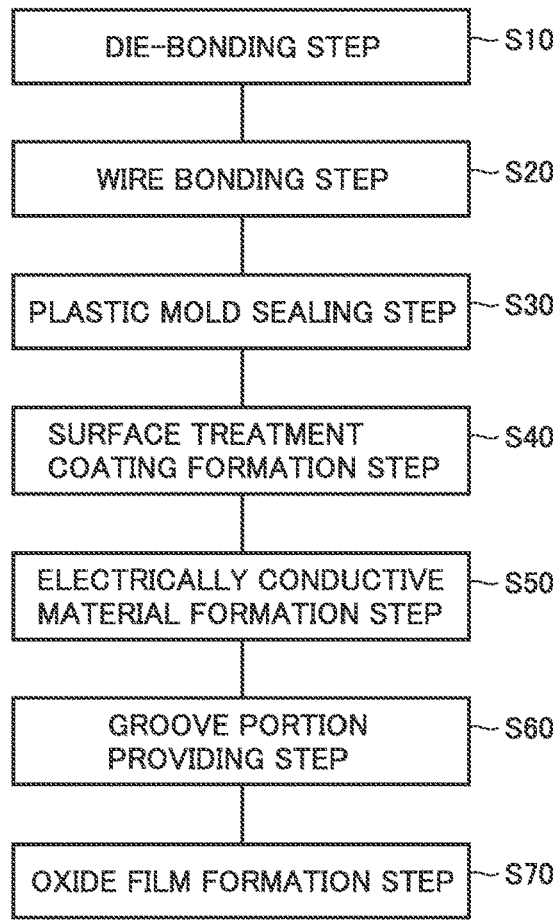
FIG. 3 is a flowchart illustrating a method of manufacturing a semiconductor device according to the first embodiment.

FIG. 3 is a flowchart illustrating the steps included in the method of manufacturing a semiconductor device 100 according to the present embodiment. Referring to FIG. 3, a die-bonding step (S10), that is, the step of joining semiconductor element 2 to die-attach portion 11 of lead frame 1, is performed. It is to be noted that a lead frame is prepared before this step.

Figure 4:
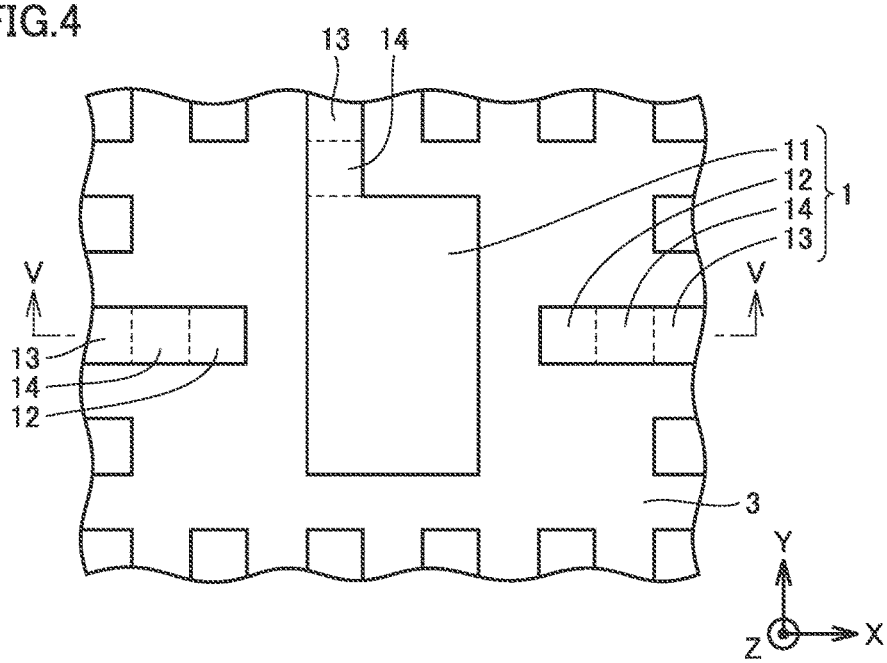
FIG. 4 is a schematic plan view showing the first step of the method of manufacturing a semiconductor device according to the first embodiment.
Figure 5:
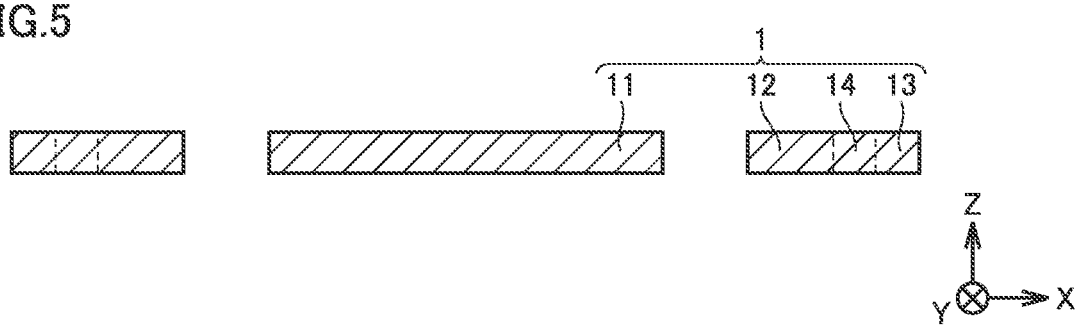
FIG. 5 is a schematic cross-sectional view showing the first step of the method of manufacturing a semiconductor device according to the first embodiment.

FIG. 4 is a schematic plan view of a lead frame used in the method of manufacturing a semiconductor device 100 according to the present embodiment. FIG. 5 is a schematic cross-sectional view of a portion of the lead frame in FIG. 4, which is taken along a line V-V in FIG. 4. Thus, the arrangement of each of members in FIG. 4 is basically the same as the arrangement of each of the members in the semiconductor device according to the present embodiment in FIG. 1. Referring to FIGS. 4 and 5, lead frame 1 including die-attach portion 11, signal terminal portion 12 and ground terminal portion 13 is first prepared. In this case, basically, only a single lead frame 1 is prepared for one semiconductor device 100.

As described above, basically, die-attach portion 11, signal terminal portion 12 and ground terminal portion 13 are disposed so as to be arranged in the direction (for example, the X direction) along one main surface 1a of lead frame 1. Also in FIG. 4, die-attach portion 11, signal terminal portion 12 and ground terminal portion 13 are arranged in this order from the inside to the outside in the X direction. In other words, signal terminal portion 12 is disposed on the outside of die-attach portion 11, and ground terminal portion 13 is disposed on the outside of signal terminal portion 12. Also in FIG. 4, die-attach portion 11 and ground terminal portion 13 are arranged in this order from the inside to the outside in the Y direction.

In lead frame 1, initially, die-attach portion 11 and ground terminal portion 13 that are located adjacent to each other at a distance from each other in the Y direction in FIG. 4 are coupled to each other through a tie bar 14 located therebetween. Also, signal terminal portion 12 and ground terminal portion 13 that are located adjacent to each other at a distance from each other in the X direction in FIG. 4 are coupled to each other through tie bar 14 located therebetween. In other words, lead frame 1 is initially (before the step of removing tie bar 14 (described below)) is formed as a flat plate-shaped member formed by integrating all of die-attach portion 11, signal terminal portion 12, ground terminal portion 13, and tie bar 14, as shown in the figure. Accordingly, for example, as compared with the case where these members 11 to 14 are distinct members that are separate from each other, lead frame 1 in each step is readily handled, so that semiconductor device 100 can be efficiently fabricated. This is because all of these members 11 to 14 are integrated with each other, so that the positional relation among these members is maintained.

Lead frame 1 is made of an alloy of copper or iron and nickel as described above and formed in a flat plate shape. In the step of forming lead frame 1, for example, a copper material such as tough pitch copper or oxygen-free copper is subjected to cold rolling or the like, so that a metal member is formed in a flat plate shape having one main surface 1a and the other main surface 1b. Then, by wire electric discharge machining, press working and the like, die-attach portion 11, signal terminal portion 12, ground terminal portion 13 and the like are formed to be provided in any number and in any arrangement. The portion of tie bar 14 that is located between ground terminal portion 13 and die-attach portion 11 or signal terminal portion 12 may be provided with a conveyance margin, a positioning hole, a pilot hole or the like used for handling of lead frame 1 in the steps and between the steps.

Figure 6:
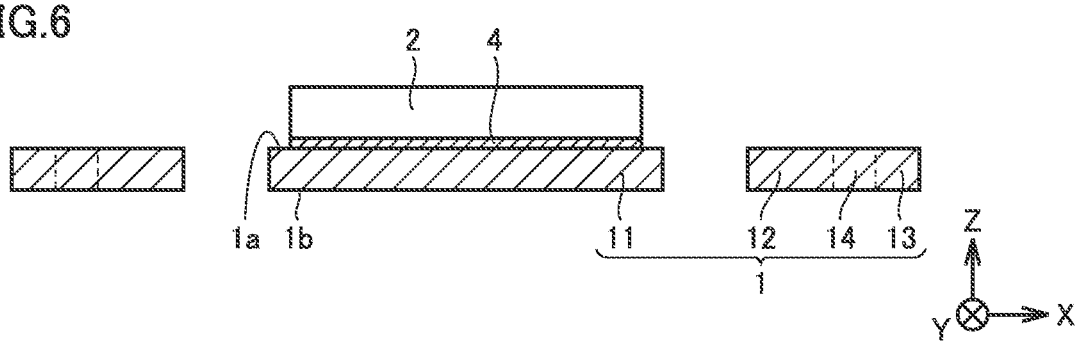
FIG. 6 is a schematic cross-sectional view showing the second step of the method of manufacturing a semiconductor device according to the first embodiment.

FIG. 6 is a schematic cross-sectional view showing the state of the lead frame in the step subsequent to FIG. 5. Referring to FIGS. 6 and 3, semiconductor element 2 is joined onto one main surface 1a of a portion allocated as die-attach portion 11 in lead frame 1 formed as shown in FIGS. 4 and 5 (S10). When a solder material is used as joining material 4 in this case, an appropriate amount of string-shaped wire solder or plate-shaped ribbon solder is cut and used.

When the step in FIG. 6 is performed using joining material 4 made of solder without using a flux in this case, the concentration of oxygen such as nitrogen around die-attach portion 11 is first lowered to about 200 ppm, and then heated to a temperature equal to or higher by about 20° C. and equal to or lower by about 30° C. than the melting point of solder. Thereby, the solder is melted, so that joining material 4 is sufficiently fitted between die-attach portion 11 of lead frame 1 and semiconductor element 2. In this case, it is preferable to move semiconductor element 2 in the horizontal direction, that is, in the direction along an X-Y plane. This allows joining material 4 to be more excellently fitted between die-attach portion 11 and semiconductor element 2. Heating is ended when the solder of joining material 4 is sufficiently fitted. Then, joining material 4 is cooled to a temperature lower than the melting point of solder, so that joining material 4 is solidified. In this case, it is preferable that the cooling rate at the temperature around the melting point of solder is set to be equal to or higher than 4° C. and equal to or lower than 6° C. per second. This can reduce the difference between the solder solidifying timings, which is caused in response to the temperature difference between the outer circumference portion and the inside of joining material 4 that is located between die-attach portion 11 and semiconductor element 2 in a plan view. Thereby, the state of joining by joining material 4 can be excellently improved.

When the step in FIG. 6 is performed using joining material 4 made of solder also using a flux in this case, a flux in a liquid state or in a paste state may be supplied to string-shaped wire solder or plate-shaped ribbon solder. Alternatively, solder paste obtained by mixing powdered solder and a flux in advance may be used. In order to remove the residue of the flux adhering around the solder after the soldering step ends, lead frame 1 having semiconductor element 2 joined thereto is immersed in a flux cleaning solution. Then, the flux is dissolved. In this case, it is preferable that lead frame 1 having semiconductor element 2 soldered thereto is shaken in the flux cleaning solution, the flux cleaning solution is caused to flow, or ultrasonic vibrations are applied to the flux cleaning solution. In this way, all of the flux residue can be readily removed. Also, it is preferable to warm the flux cleaning solution in advance in order to improve the solubility of the flux in the flux cleaning solution.

Also when the step in FIG. 6 is performed using an electrically conductive adhesive as joining material 4 in this case, a dispensing scheme may be employed in which an electrically conductive adhesive filled in a syringe container is pushed out with air pressure, or a stamp scheme may be employed in which an electrically conductive adhesive spread over a transfer pan is transferred in a manner of a stamp. Thereby, a desired amount of electrically conductive adhesive is supplied to die-attach portion 11, on which semiconductor element 2 is then mounted, and then, the electrically conductive adhesive is pressed and spread. Then, the electrically conductive adhesive is heated by an oven and thereby thermally hardened, so that lead frame 1 to which semiconductor element 2 is joined is formed.

Figure 7:
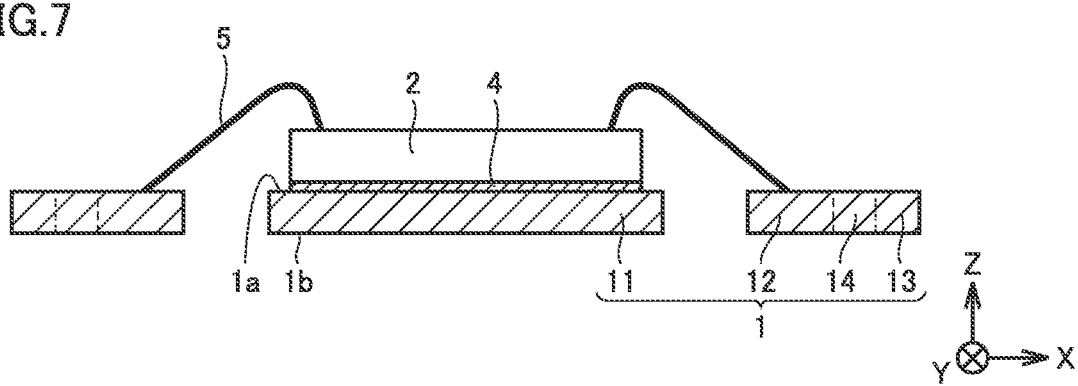
FIG. 7 is a schematic cross-sectional view showing the third step of the method of manufacturing a semiconductor device according to the first embodiment.

FIG. 7 is a schematic cross-sectional view showing the state of the lead frame in the step subsequent to FIG. 6. Referring to FIGS. 7 and 3, a wire bonding step (S20) is performed, in which semiconductor element 2 joined to lead frame 1 as shown in FIG. 6 and signal terminal portion 12 are electrically joined through thin metal wire 5. Thin metal wire 5 is provided as a thin wire made of aluminum, for example. In the wire bonding step, thin metal wire 5 is first placed through a cylindrical capillary tool. Then, the tip end of thin metal wire 5 is heated and melted to form an initial ball. Thereby, thin metal wire 5 is ultrasonic heated and pressure bonded to semiconductor element 2 and the like.

Figure 8:
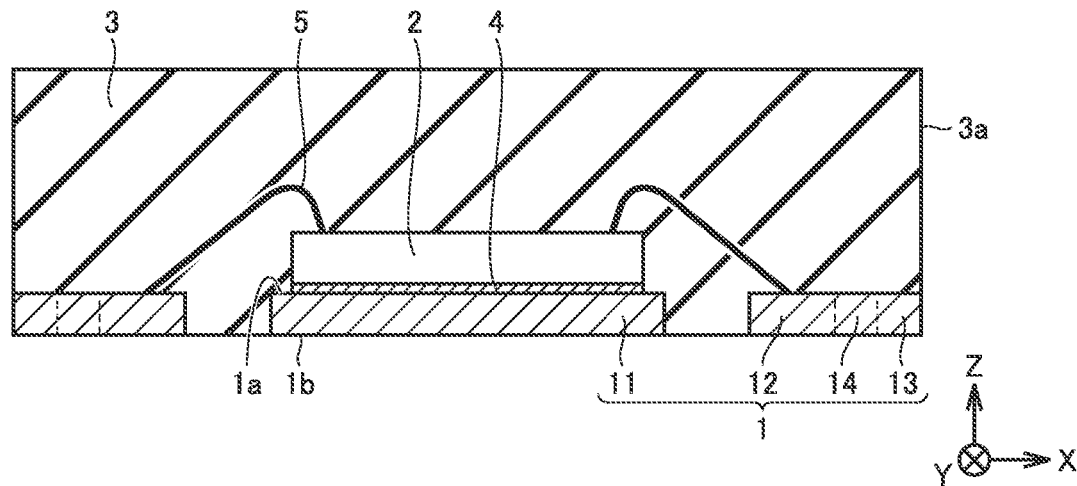
FIG. 8 is a schematic cross-sectional view showing the fourth step of the method of manufacturing a semiconductor device according to the first embodiment.

FIG. 8 is a schematic cross-sectional view showing the state of the lead frame in the step subsequent to FIG. 7. Referring to FIGS. 8 and 3, a plastic mold sealing step (S30) is performed, in which mold material 3 serves to cover one main surface 1a of lead frame 1 and seal semiconductor element 2. Specifically, in the state where a metal mold having an inner wall surface to which a mold release material is thinly applied is heated in advance, lead frame 1 having semiconductor element 2 and thin metal wire 5 joined thereto as described above is placed inside the metal mold. Then, for example, by the transfer mold method, mold material 3 made of heated and softened plastic is pushed and introduced into the metal mold. Thereby, the inside of the metal mold is filled with mold material 3. Then, mold material 3 is hardened while maintaining the state where the metal mold is pressurized therein. Since the mold release material adheres to the inner wall surface of the metal mold, the hardened mold material 3 is readily removed without fixedly adhering to the metal mold.

By this step, mold material 3 is supplied so as to be overlaid directly above die-attach portion 11, signal terminal portion 12 and ground terminal portion 13. Thus, die-attach portion 11, signal terminal portion 12 and ground terminal portion 13 in lead frame 1 are disposed directly below mold material 3 so as to be arranged in the direction along one main surface 1a. Also, each of the surfaces of die-attach portion 11, signal terminal portion 12 and ground terminal portion 13 that are located on the main surface 1a side is covered with mold material 3 so as to be sealed.

As described above, ground terminal portion 13 is disposed on the outside of die-attach portion 11 and signal terminal portion 12 in a plan view. In the step in FIG. 8, ground terminal portion 13 is disposed on the outer circumferential portion of mold material 3 in a plan view.

Figure 9:
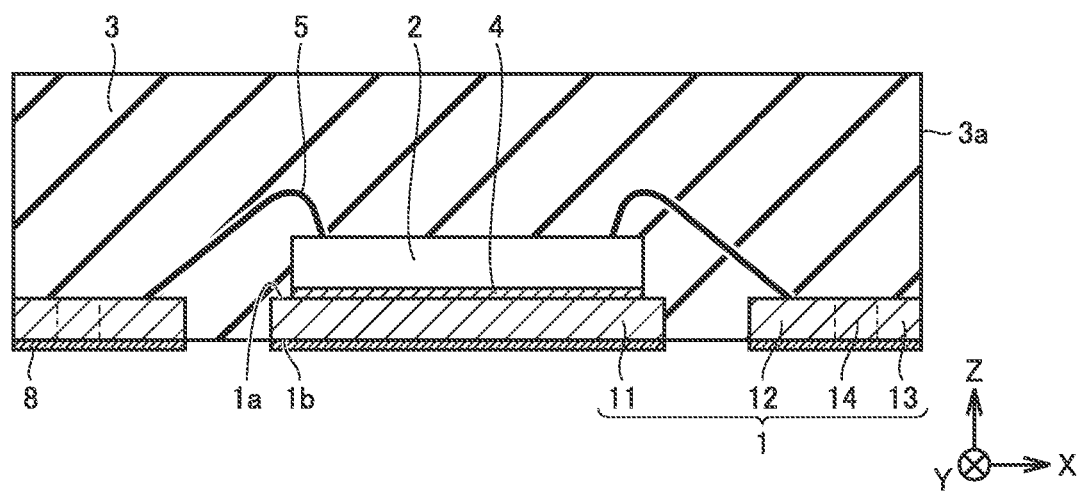
FIG. 9 is a schematic cross-sectional view showing the fifth step of the method of manufacturing a semiconductor device according to the first embodiment.

FIG. 9 is a schematic cross-sectional view showing the state of the lead frame in the step subsequent to FIG. 8. Referring to FIGS. 9 and 3, a surface treatment coating formation step (S40) is performed, in which coating film 8 is formed on the other main surface 1b on the opposite side of one main surface 1a of each of die-attach portion 11, signal terminal portion 12 and ground terminal portion 13. In this step, coating film 8 is formed entirely over the other main surface 1b of lead frame 1, so that coating film 8 is formed also on the other main surface 1b of the portion corresponding to tie bar 14, for example. Coating film 8 may be formed, for example, due to adhesion of a rust preventive film made of imidazole as a result of immersion in a liquid phase of a rust preventive material such as imidazole.

Alternatively, when a plating film is formed as coating film 8, the following process is performed. First, lead frame 1 including semiconductor element 2 and the like sealing by mold material 3 is washed by an acid cleaning solution. This leads to removal of the oxide film on the other main surface 1b of the portion particularly corresponding to each of die-attach portion 11, signal terminal portion 12, ground terminal portion 13, and tie bar 14 in lead frame 1. Then, lead frame 1 is immersed in an electroless plating solution, so that an electroless plating film is deposited on the other main surface 1b. When an electroless nickel gold plating film is formed in this step, it is preferable that the layered films forming this electroless nickel gold plating film include: an electroless nickel plating film having a thickness of 5 μm or more; and an electroless gold plating film having a thickness of 0.05 μm or more. This can suppress occurrence of defects that may be caused when the completed semiconductor device 100 is surface-mounted on high frequency equipment.

Figure 10:
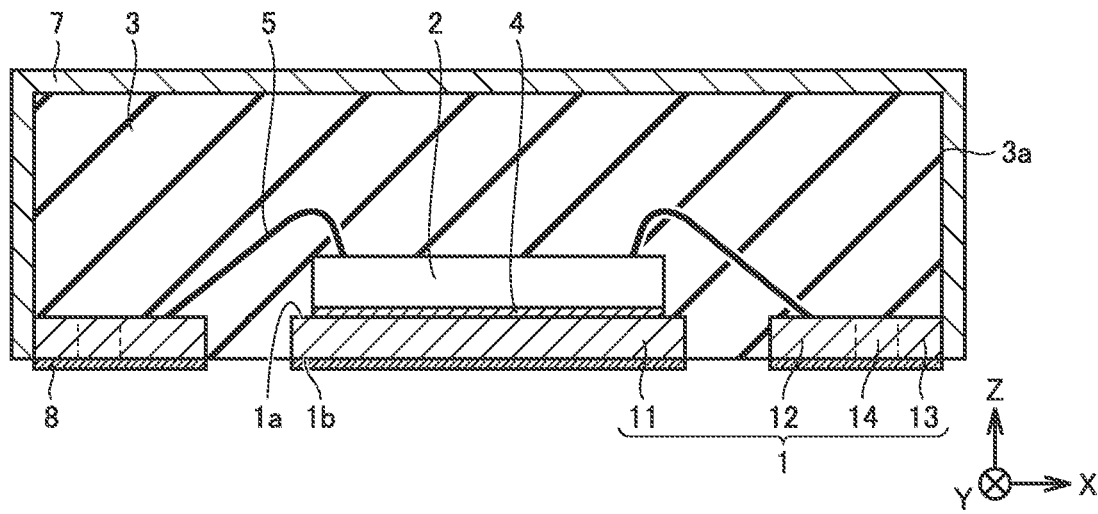
FIG. 10 is a schematic cross-sectional view showing the sixth step of the method of manufacturing a semiconductor device according to the first embodiment.

FIG. 10 is a schematic cross-sectional view showing the state of the lead frame in the step subsequent to FIG. 9. Referring to FIGS. 10 and 3, an electrically conductive material formation step (S50) is performed, in which electrically conductive material 7 is formed to cover at least a part of mold material 3 and to be in contact with at least the side surface (the first side surface) of ground terminal portion 13. In this case, a mold release material on the inner wall surface of the metal mold used in the sealing step adheres to the surface of mold material 3. Accordingly, it is preferable that a thin film of electrically conductive material 7 is formed after the adhering mold release material is sufficiently removed. It is preferable that electrically conductive material 7 is formed after the other main surface 1b of lead frame 1 is covered in advance with a mask member. This can suppress adhesion of electrically conductive material 7 to the other main surface 1b.

When the thin film of electrically conductive material 7 is made of a thin metal film of a copper alloy, a nickel alloy or the like, it is preferable that electrically conductive material 7 is formed by a processing method selected from the group consisting of: vapor deposition; sputtering; electroplating; and electroless plating. Alternatively, when the thin film of electrically conductive material 7 is formed of a thin film of an electrically conductive adhesive such as a silver paste, it is preferable to form this thin film of electrically conductive material 7 by using an oven or the like to thermally harden electrically conductive material 7 applied onto the surface and the like of mold material 3 by any one method selected from the group consisting of: screen printing; spraying; and electro-deposition coating. In this case, when a pressure-sensitive adhesive tape is affixed in advance as a mask member onto the other main surface 1b of lead frame 1, the mask member can be readily removed after a silver paste is applied. This can suppress occurrence of defects that may be caused when the completed semiconductor device 100 is surface-mounted on high frequency equipment.

Figure 11:
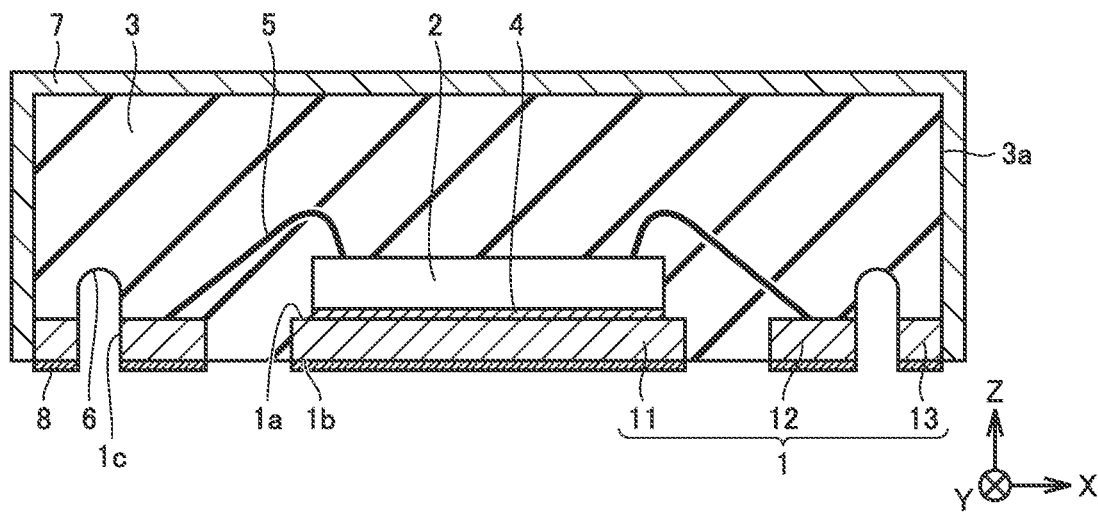
FIG. 11 is a schematic cross-sectional view showing the seventh step of the method of manufacturing a semiconductor device according to the first embodiment.

FIG. 11 is a schematic cross-sectional view showing the state of the lead frame in the step subsequent to FIG. 10. Referring to FIGS. 11 and 3, a groove portion providing step (S60) is performed, in which groove portion 6 is provided by partially removing lead frame 1 so as to allow groove portion 6 to pass through lead frame 1 such that groove portion 6 is provided between die-attach portion 11 and ground terminal portion 13 that are adjacent to each other and between signal terminal portion 12 and ground terminal portion 13 that are adjacent to each other. Specifically, the portion of tie bar 14 in lead frame 1 and the portion of coating film 8 that overlaps therewith are removed to provide a groove portion so as to pass through lead frame 1 from the other main surface 1b to one main surface 1a. Thereby, die-attach portion 11 and ground terminal portion 13 that are spaced apart from each other are separated from each other while signal terminal portion 12 and ground terminal portion 13 that are spaced apart from each other are separated from each other. Furthermore, groove portion 6 is provided so as to reach the inside of mold material 3 that is in contact with the portion of tie bar 14 of lead frame 1 in the Z direction in an overlapping manner. In other words, groove portion 6 is provided by partially removing mold material 3 in a region overlapping with the removed portion of lead frame 1 in a plan view, as shown in FIG. 11. Also in other words, groove portion 6 extends from lead frame 1 to the inside of mold material 3 in the Z direction.

As the means for providing groove portion 6, cutting processing such as blade saw processing using a disc-shaped saw and router processing using a cylindrical drill may be used, or laser beam machining using a laser beam may be used.

Again referring to FIGS. 2 and 3, an oxide film formation step (S70) is performed, in which oxide film 9 is formed on side surface 1c (the second side surface) along which die-attach portion 11, signal terminal portion 12 and ground terminal portion 13 adjoin to groove portion 6. Specifically, after groove portion 6 is provided, lead frame 1 is heat-treated in an oven with atmospheric air. Thereby, a fine oxide film 9 is formed on the second side surface along which each of die-attach portion 11, signal terminal portion 12 and ground terminal portion 13 of lead frame 1 adjoins to groove portion 6.

Although not shown, semiconductor device 100 formed as described above is surface-mounted on high-frequency applicable equipment so as to be used.

In the following, the functions and effects of the present embodiment will be described with reference to a comparative example.

Figure 12:
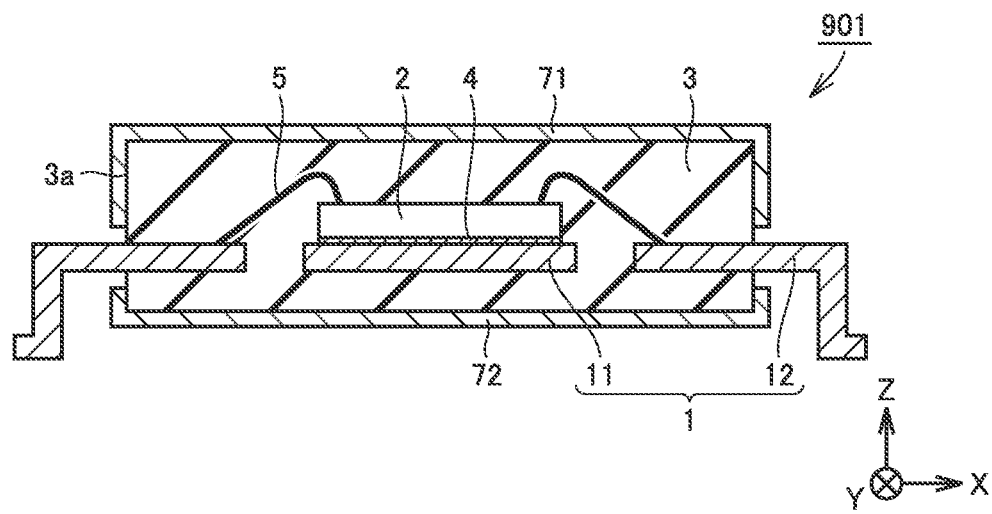
FIG. 12 is a schematic cross-sectional view of a semiconductor device in the first comparative example.

FIG. 12 is a schematic cross-sectional view of a semiconductor device according to the first comparative example. Referring to FIG. 12, for a semiconductor device 901 according to the first comparative example, the same components as those in semiconductor device 100 according to the present embodiment will be designated by the same reference characters, and the description thereof will not be repeated. As shown in FIG. 12, in the first comparative example, lead frame 1 includes die-attach portion 11 and signal terminal portion 12, and the entire semiconductor element 2 joined onto die-attach portion 11 and a part of signal terminal portion 12 are covered and sealed by mold material 3. A part of signal terminal portion 12 extends so as to protrude from an outermost surface 3a of mold material 3 to the outside in a plan view. In addition, outermost surface 3a of mold material 3 located above signal terminal portion 12 in the Z direction is covered by an upper metal case 71 corresponding to electrically conductive material 7 of semiconductor device 100. Also, outermost surface 3a of mold material 3 located below signal terminal portion 12 in the Z direction is covered by a lower metal case 72 corresponding to electrically conductive material 7 of semiconductor device 100.

In such semiconductor device 901, signal terminal portion 12 protrudes from mold material 3 to the outside in a plan view, so that the area occupied by the entire device is increased.

Figure 13:
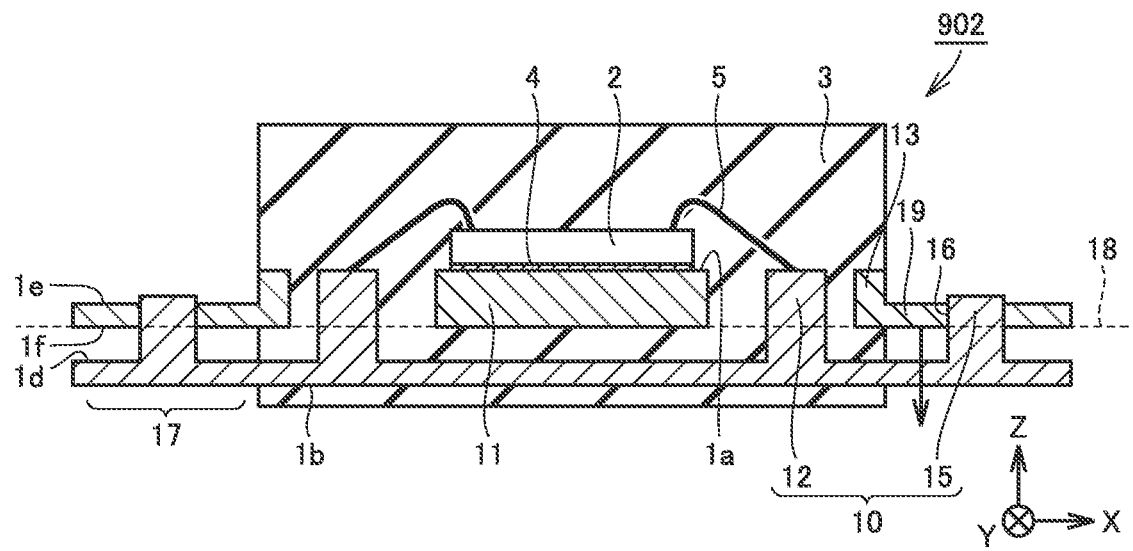
FIG. 13 is a schematic cross-sectional view showing the state in one step at some midpoint in a process of forming a semiconductor device in the second comparative example.

FIG. 13 is a schematic cross-sectional view showing the state in one step at some midpoint in a process of forming a semiconductor device in the second comparative example. Referring to FIG. 13, for a semiconductor device 902 according to the second comparative example, the same components as those in semiconductor device 100 according to the present embodiment will be designated by the same reference characters, and the description thereof will not be repeated. As shown in FIG. 13, in the second comparative example, two lead frames including a first lead frame 10 and a second lead frame 19 are disposed as lead frames. These two lead frames are overlapped with each other in the Z direction in the step of manufacturing semiconductor device 902.

Specifically, in the manufacturing step, first lead frame 10 includes a signal terminal portion 12 and an insertion portion 15 that is located on the outside of signal terminal portion 12 in the X direction. Signal terminal portion 12 and insertion portion 15 are spaced apart from each other in the X direction. Signal terminal portion 12 and insertion portion 15 each extend upward in the Z direction from the base portion that includes: a main surface 1d on the upper side of first lead frame 10 in the Z direction; and the other main surface 1b on the opposite side of main surface 1d. Furthermore, the other main surface 1b is formed as a main surface of the lowermost portion of the two entire lead frames in the Z direction.

On the other hand, second lead frame 19 includes die-attach portion 11 and ground terminal portion 13 that is located on the outside of die-attach portion 11 in the X direction. Die-attach portion 11 and ground terminal portion 13 are spaced apart from each other in the X direction. Die-attach portion 11 is disposed in the center portion of second lead frame 19. Also, the upper main surface of die-attach portion 11 is formed as one main surface 1a corresponding to the uppermost main surface of the two entire lead frames in the Z direction. Most part of ground terminal portion 13 is formed as a portion located on the outside of die-attach portion 11 and including: a main surface 1e on the upper side in the Z direction; and a main surface 1f on the opposite side of main surface 1e and on the lower side in the Z direction. In this case, a portion of ground terminal portion 13 that is located closest to die-attach portion 11 is slightly bent so as to extend in the Z direction. Ground terminal portion 13 is provided with an opening 16 that passes through ground terminal portion 13 in the Z direction from main surface 1e on the upper side to main surface 1f on the lower side.

Insertion portion 15 of first lead frame 10 is inserted into opening 16 of second lead frame 19, thereby forming a fitted region 17 in which two lead frames are fitted to each other. The entirety of die-attach portion 11, signal terminal portion 12 and semiconductor element 2, and a part of ground terminal portion 13 (a portion closest to die-attach portion 11 that is bent so as to extend in the Z direction) are sealed by mold material 3 while most part of ground terminal portion 13 and opening 16 are disposed on the outside of mold material 3.

After two lead frames are assembled by fitted region 17 as described above, the portion below a dashed line 18 in the Z direction is removed, thereby forming semiconductor device 902. In this semiconductor device 902, each of signal terminal portion 12 and ground terminal portion 13 is exposed from the lowermost surface of mold material 3 after the above-mentioned removal. This can eliminate the problem that the entire area is increased by a lead frame as in semiconductor device 901. However, semiconductor device 902 has a configuration in which two lead frames are assembled, thereby complicating the step of assembling these two lead frames. Furthermore, fitted region 17 and the like are eventually removed. Thus, only a small portion of the produced lead frames eventually remains in semiconductor device 902, which leads to a problem that the utilization efficiency of the lead frame materials for a product is deteriorated.

Thus, in semiconductor device 100 according to the present embodiment, die-attach portion 11, signal terminal portion 12 and ground terminal portion 13 are first disposed directly below mold material 3 so as to be arranged in the direction along one main surface 1a of lead frame 1. In other words, signal terminal portion 12 does not protrude from mold material 3 in a plan view, unlike semiconductor device 901. Accordingly, the area occupied by semiconductor device 100 can be equal to the plane area of mold material 3, and can be smaller than that in the configuration of semiconductor device 901. Thus, also when semiconductor device 100 is surface-mounted on high-frequency applicable equipment, the area occupied by this semiconductor device 100 can be reduced.

Furthermore, semiconductor device 100 is formed only of single lead frame 1. This eliminates the need to employ the manufacturing method of assembling two lead frames as in semiconductor device 902, so that the manufacturing step can be simplified. Also, fitted region 17 and a region to be removed are eliminated, so that the utilization efficiency of the lead-frame forming material for a product can be improved.

In addition, in semiconductor device 100 according to the present embodiment, groove portion 6 is provided between die-attach portion 11 and ground terminal portion 13 so that die-attach portion 11 and ground terminal portion 13 are electrically insulated from each other, and also, groove portion 6 is provided between signal terminal portion 12 and ground terminal portion 13 so that signal terminal portion 12 and ground terminal portion 13 are electrically insulated from each other. Furthermore, ground terminal portion 13 is connected to a ground potential, and disposed on the outer circumferential portion of mold material 3 in a plan view. Thereby, ground terminal portion 13 is readily connected to the ground potential, and signal terminal portion 12 can block an input and an output of electromagnetic waves to the outside. This is because ground terminal portion 13 serves to block the input of electromagnetic waves to signal terminal portion 12 and the output of electromagnetic waves from signal terminal portion 12 while maintaining insulation from signal terminal portion 12.

In order to block the input/output of electromagnetic waves as mentioned above, in lead frame 1 according to the present embodiment, it is preferable that signal terminal portion 12 is disposed on the outside of die-attach portion 11 while ground terminal portion 13 is disposed on the outside of signal terminal portion 12. Thereby, ground terminal portion 13 can surround signal terminal portion 12 from the outside in a plan view, thereby enhancing the effect by ground terminal portion 13 of blocking the input of electromagnetic waves to signal terminal portion 12 and the output of electromagnetic waves from signal terminal portion 12.

Furthermore, electrically conductive material 7 is formed so as to be in contact with at least the first side surface of ground terminal portion 13. Since electrically conductive material 7 is formed so as to cover at least a part of mold material 3 (basically, the almost entirety of the uppermost surface and the side surface), electrically conductive material 7 and ground terminal portion 13 are brought into contact with each other and set to be at the same potential. Thereby, an electromagnetic shield structure is formed by ground terminal portion 13 and electrically conductive material 7 that covers the outermost surface of mold material 3. Thus, ground terminal portion 13 can enhance the blocking effect for signal terminal portion 12 surrounded by this ground terminal portion 13.

Oxide film 9 is formed on the second side surface of the side surfaces of groove portion 6, which is in contact with die-attach portion 11, signal terminal portion 12 and ground terminal portion 13. Thereby, it becomes possible to prevent wetting and spreading of the mounting solder from occurring on the second side surface of groove portion 6 when semiconductor device 100 is surface-mounted on high-frequency applicable equipment. This is because oxide film 9 is less likely to be wet with solder. Accordingly, it becomes possible to decrease the possibility that die-attach portion 11, signal terminal portion 12 and ground terminal portion 13 in lead frame 1 are electrically short-circuited.

Second Embodiment

Since the semiconductor device according to the present embodiment has basically the same configuration as that of semiconductor device 100 according to the first embodiment, the detailed explanation thereof will not be repeated. The present embodiment is different partially in the manufacturing method from the first embodiment. In the following, the method of manufacturing a semiconductor device in the present embodiment will be described with reference to FIG. 14.

Figure 14:
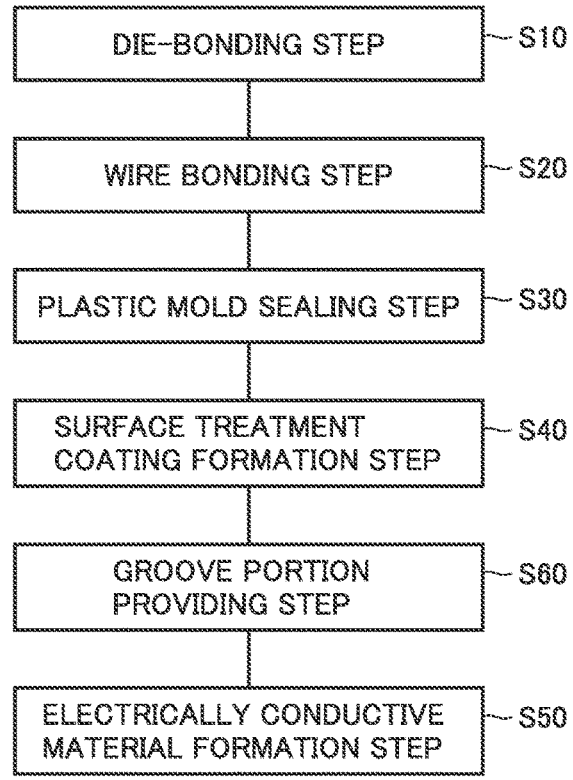
FIG. 14 is a flowchart illustrating a method of manufacturing a semiconductor device according to the second embodiment.

FIG. 14 is a flowchart illustrating the steps included in the method of manufacturing a semiconductor device 100 according to the present embodiment. Referring to FIG. 14, in the present embodiment, the order of the electrically conductive material formation step (S50) and the groove portion providing step (S60) in the manufacturing method in the first embodiment in FIG. 3 is reversed. Specifically, in the present embodiment, the step of forming electrically conductive material 7 (see FIG. 10) is performed after the step of providing groove portion 6 (see FIG. 11).

The manufacturing method according to the present embodiment is basically the same as the manufacturing method according to the first embodiment except for the above-described points, and therefore, the description thereof will not be hereinafter repeated.

Although not described above, there is an additional step of drying moisture adhering to semiconductor device 100 after a plating film made of a copper alloy, a nickel alloy or the like is processed as electrically conductive material 7. Thus, for example, when a plating film is formed as electrically conductive material 7 after groove portion 6 is provided, oxide film 9 can be formed on the second side surface of groove portion 6 in the step of drying moisture. Accordingly, in the present embodiment, the oxide film formation step (S70) can be substantially eliminated.

Third Embodiment

Since the semiconductor device according to the present embodiment has basically the same configuration as that of semiconductor device 100 according to the first embodiment, the same components as those in semiconductor device 100 will be hereinafter designated by the same reference characters, and the description thereof will not be repeated. It is to be noted that the present embodiment is different partially in configuration from the first embodiment. In the following, structural differences between the semiconductor device in the present embodiment and semiconductor device 100 will be described with reference to FIG. 15.

Figure 15:
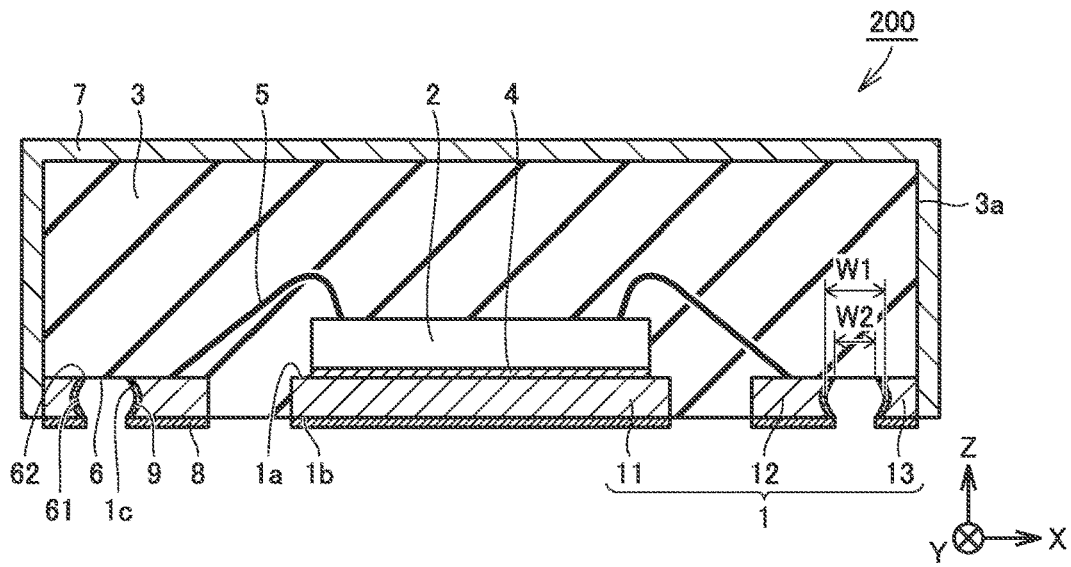
FIG. 15 is a schematic cross-sectional view of a semiconductor device according to the third embodiment.

FIG. 15 is a schematic cross-sectional view of a semiconductor device according to the third embodiment. Referring to FIG. 15, a semiconductor device 200 according to the present embodiment is different in configuration of groove portion 6 from semiconductor device 100. Specifically, groove portion 6 in semiconductor device 200 is approximately barrel-shaped in such a manner that a width W1 in the X direction (and the Y direction) in the center portion in the Z direction is greater in a cross-sectional view than a width W2 in the X direction (and the Y direction) at each of the upper end portion and the lower end portion in the Z direction.

In other words, groove portion 6 in semiconductor device 200 includes: a first region 61 in the center portion in the Z direction in a cross-sectional view; and a second region 62 excluding the first region, that is, located at the upper end portion and the lower end portion in the Z direction in a cross-sectional view. Groove portion 6 is provided such that its second side surface 1c bulges outward in such a manner that width W1 in the X direction and the Y direction along one main surface 1a in first region 61 is greater than width W2 in the X direction and the Y direction along one main surface 1a in second region 62. As a result, side surface 1c along which signal terminal portion 12 and ground terminal portion 13 adjoin to groove portion 6 is curved so as to bulge as described above, as shown in FIG. 15. Since side surface 1c of groove portion 6 is curved, oxide film 9 formed thereon is similarly curved in a barrel shape. It is preferable that width W1 is 1.1 times or more and 1.3 times or less, for example, 1.2 times, as large as width W2.

Furthermore, FIG. 15 shows an example in which groove portion 6 between signal terminal portion 12 and ground terminal portion 13 has a barrel shape. In the present embodiment, groove portion 6 between die-attach portion 11 and ground terminal portion 13 may also be similarly formed to have a barrel shape.

The method of manufacturing a semiconductor device 200 according to the present embodiment is basically the same as the method of manufacturing a semiconductor device 100 according to the first embodiment, but is slightly different therefrom in the process for providing a barrel-shaped groove portion 6 as described above. The method of manufacturing a semiconductor device according to the present embodiment will be described below with reference to the flowchart in FIG. 16 and the schematic diagrams in FIGS. 17 and 18.

Figure 16:
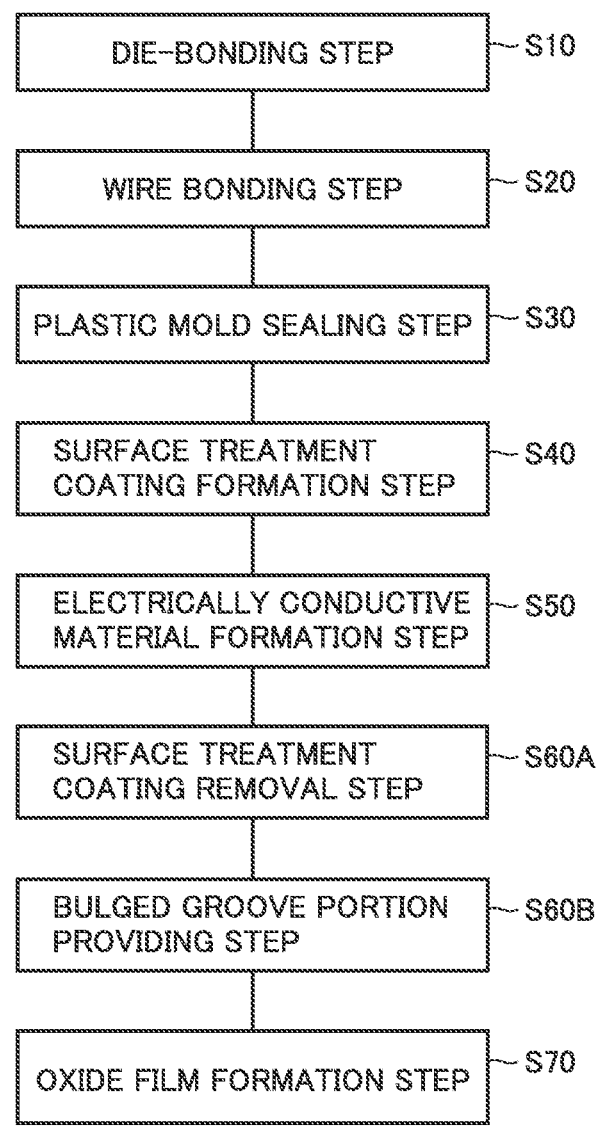
FIG. 16 is a flowchart illustrating a method of manufacturing a semiconductor device according to the third embodiment.

FIG. 16 is a flowchart illustrating the steps included in the method of manufacturing a semiconductor device 200 according to the present embodiment. Referring to FIG. 16, in the method of manufacturing semiconductor device 200 according to the present embodiment, the steps up to the steps (S10) to (S50) are performed in the same manner as in the first embodiment, and therefore, the description thereof will not be hereinafter repeated.

Figure 17:
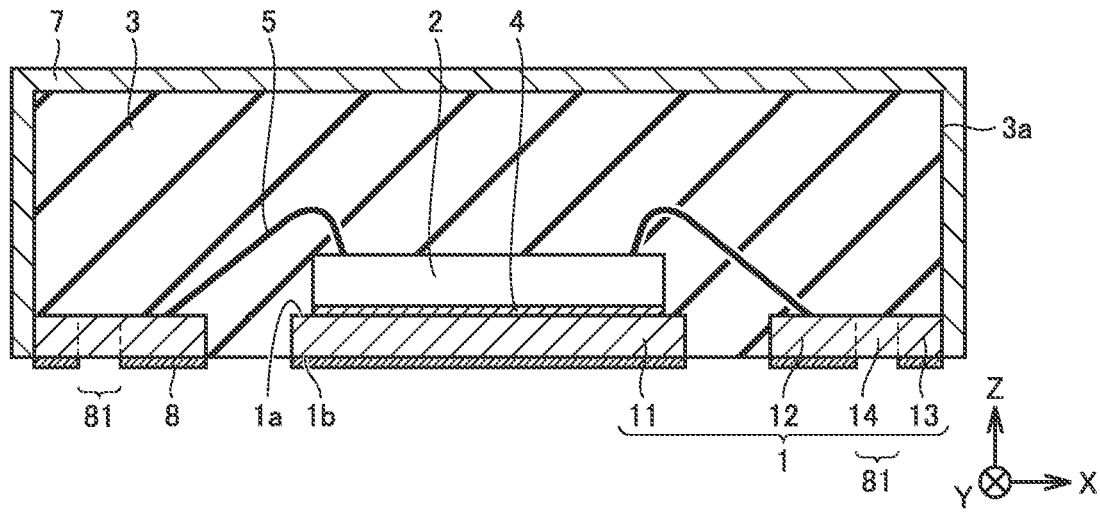
FIG. 17 is a schematic cross-sectional view showing the seventh step subsequent to the step in FIG. 10 of the method of manufacturing a semiconductor device according to the third embodiment.

FIG. 17 is a schematic cross-sectional view showing the state of the lead frame in the step subsequent to the step (S50) in the first embodiment, that is, the step of forming electrically conductive material 7 shown in FIG. 10. Referring to FIGS. 17 and 16, a surface treatment coating removal step (S60A) is performed, in which coating film 8 as a surface treatment coating formed in the step (S40) is partially removed. Specifically, the surface treatment coating removal step (S60A) is performed as a part of the step of providing groove portion 6, and performed to remove coating film 8 formed so as to overlap with tie bar 14 on the region in which groove portion 6 is to be provided, that is, on the other main surface 1b of tie bar 14.

In order to allow a coating film removed region 81 having coating film 8 removed therefrom to be formed directly below tie bar 14 as shown in FIG. 17, for example, the following process is performed. A mask member (not shown) is attached to the lower surface of coating film 8 in the Z direction that is formed in the region other than the region directly below tie bar 14. In this state, lead frame 1 is introduced and immersed in the first chemical solution. It is preferable that the first chemical solution used herein is a chemical solution that can readily dissolve coating film 8 but cannot readily dissolve lead frame 1. This leads to dissolution and removal of coating film 8 formed on tie bar 14 that is exposed because a mask member is not attached thereto. Consequently, the state shown in FIG. 17 is achieved.

Alternatively, coating film removed region 81 may be formed by the following method. For example, only a portion of coating film 8 that is formed on tie bar 14 is subjected to laser beam machining, thereby removing only this portion of coating film 8, so that coating film removed region 81 is provided.

Figure 18:
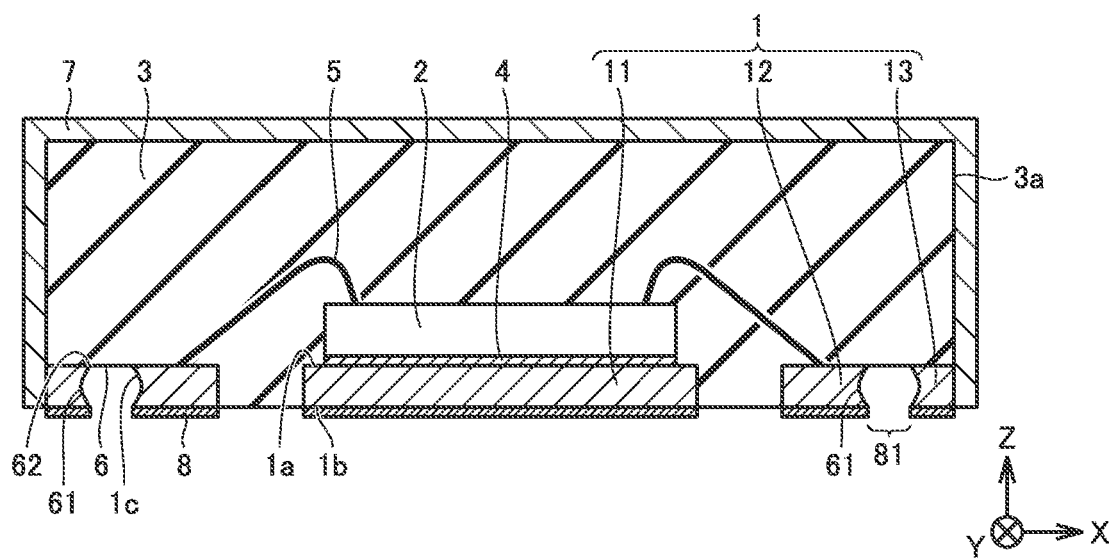
FIG. 18 is a schematic cross-sectional view showing the eighth step subsequent to the step in FIG. 17 of the method of manufacturing a semiconductor device according to the third embodiment.

FIG. 18 is a schematic cross-sectional view showing the state of the lead frame in the step subsequent to FIG. 17. Referring to FIGS. 18 and 16, lead frame 1 is introduced and immersed in the second chemical solution in the state where coating film removed region 81 is provided directly below tie bar 14. It is preferable that the second chemical solution used herein is a chemical solution that cannot readily dissolve coating film 8 but can readily dissolve lead frame 1. Thereby, a portion of lead frame 1 that overlaps with coating film removed region 81 is removed without removing coating film 8.

In this case, not only in the portion of tie bar 14 that overlaps with coating film removed region 81 but also particularly in the center portion of lead frame 1 in the Z direction, signal terminal portion 12 and ground terminal portion 13 located therearound are partially dissolved. In other words, removal is done such that the width of the region from which lead frame 1 including tie bar 14 has been removed is greater than the width of the region from which coating film 8 has been removed. The width used herein means a width in the direction along one main surface 1a of lead frame 1 along the X direction (or the Y direction) in FIG. 18. Thereby, the region from which lead frame 1 has been removed is provided as groove portion 6 including: first region 61 in which second side surface 1c partially bulges outward; and second region 62 other than first region 61 (S60B). The combination of the above-described steps (S60A) and (S60B) corresponds to the groove portion providing step (S60) in the first embodiment.

Since the subsequent step (S70) is performed in the same manner as in the first embodiment, the description thereof will not be hereinafter repeated.

By providing barrel-shaped groove portion 6 including first region 61 and second region 62 as in the present embodiment, it becomes possible to increase the distance between die-attach portion 11 and signal terminal portion 12 adjacent to each other in lead frame 1 and the distance between signal terminal portion 12 and ground terminal portion 13 adjacent to each other in lead frame 1. This is because the width of groove portion 6 is increased by the amount of outward bulging of first region 61. Thus, it becomes possible to more reliably suppress wetting and spreading of surface mounting solder from occurring inside barrel-shaped groove portion 6 when semiconductor device 200 is surface-mounted on high-frequency applicable equipment.

Also in the present embodiment, the order of the steps (S50) and (S60) may be reversed as in the second embodiment. In this case, the step (S60) in FIG. 14 is replaced with the step (S60B) in FIG. 16, and the step (S60A) in FIG. 16 is inserted between the step (S40) and the step (S60B).

The characteristics described in (each of the examples included in) each of the embodiments as described above may be combined as appropriate within the range where technical inconsistency does not occur.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST

1 lead frame, 1a one main surface, 1b the other main surface, 1c side surface, 1d, 1e upper main surface, 1f lower main surface, 2 semiconductor element, 3 mold material, 3a outermost surface, 4 joining material, 5 thin metal wire, 6 groove portion, 7 electrically conductive material, 8 coating film, 9 oxide film, 10 first lead frame, 11 die-attach portion, 12 signal terminal portion, 13 ground terminal portion, 14 tie bar, 15 insertion portion, 16 opening, 17 fitted region, 18 dashed line, 19 second lead frame, 61 first region, 62 second region, 71 upper metal case, 72 lower metal case, 81 coating film removed region, 100, 200, 901, 902 semiconductor device.

The invention claimed is:

1. A semiconductor device comprising:
    a single lead frame;
    a semiconductor element that is joined onto one main surface of the single lead frame; and
    a mold material that covers the one main surface of the single lead frame and seals the semiconductor element, wherein
    the single lead frame includes
        a die-attach portion to which the semiconductor element is joined,
        a signal terminal portion electrically joined to the semiconductor element through a thin metal wire, and
        a ground terminal portion connected to a ground potential and disposed on an outer circumferential portion of the mold material in a plan view,
    the die-attach portion, the signal terminal portion and the ground terminal portion are disposed directly below the mold material so as to be arranged in a direction along the one main surface, and
    a groove portion formed in a partially removed portion of the single lead frame such that the groove portion passes through the single lead frame, the groove portion being provided between the die-attach portion and the ground terminal portion that are adjacent to each other and between the signal terminal portion and the ground terminal portion that are adjacent to each other, further comprising:
    a coating film formed on an other main surface on an opposite side of the one main surface of each of the die-attach portion, the signal terminal portion and the ground terminal portion; and
    an oxide film formed on a second side surface of the groove portion,
    the die-attach portion, the signal terminal portion and the ground terminal portion being located to adjoin to the groove portion along the second side surface.

2. The semiconductor device according to claim 1, wherein
    the signal terminal portion is disposed on an outside of the die-attach portion, and
    the ground terminal portion is disposed on an outside of the signal terminal portion.

3. The semiconductor device according to claim 1, wherein the groove portion is provided so as to reach an inside of the mold material that is in contact with the single lead frame in an overlapping manner.

4. The semiconductor device according to claim 1, further comprising:
    an electrically conductive material that covers at least a part of the mold material and that is in contact with at least a first side surface of the ground terminal portion.

5. The semiconductor device according to claim 1, wherein
    the groove portion includes a first region and a second region other than the first region, and
    the second side surface of the groove portion bulges outward such that the first region is greater in width in a direction along the one main surface than the second region.

6. A method of manufacturing a semiconductor device, the method comprising:
    preparing a single lead frame including a die-attach portion, a signal terminal portion, and a ground terminal portion that is connected to a ground potential;
    joining a semiconductor element to the die-attach portion of the single lead frame;
    electrically joining the semiconductor element and the signal terminal portion to each other through a thin metal wire;
    by a mold material, covering one main surface of the single lead frame and sealing the semiconductor element; and
    providing a groove portion by partially removing the single lead frame so as to allow the groove portion to pass through the single lead frame, the groove portion being provided between the die-attach portion and the ground terminal portion that are adjacent to each other and between the signal terminal portion and the ground terminal portion that are adjacent to each other, wherein
    in the sealing, the mold material is supplied so as to be overlaid directly above the die-attach portion, the signal terminal portion and the ground terminal portion, and
    in the sealing, the ground terminal portion is disposed on an outer circumferential portion of the mold material in a plan view, further comprising:
    forming a coating film on the other main surface on an opposite side of the one main surface of each of the die-attach portion, the signal terminal portion and the ground terminal portion; and
    forming an oxide film on a second side surface of the groove portion,
    the die-attach portion, the signal terminal portion and the ground terminal portion being located to adjoin to the groove portion along the second side surface.

7. The method of manufacturing a semiconductor device according to claim 6, wherein
    in the preparing the single lead frame,
        the signal terminal portion is formed on an outside of the die-attach portion, and
        the ground terminal portion is formed on an outside of the signal terminal portion.

8. The method of manufacturing a semiconductor device according to claim 6, wherein
    in the providing a groove portion, the groove portion is provided so as to reach an inside of the mold material that is in contact with the single lead frame in an overlapping manner.

9. The method of manufacturing a semiconductor device according to claim 6, further comprising:

forming an electrically conductive material that covers at least a part of the mold material and that is in contact with at least a first side surface of the ground terminal portion.

10. The method of manufacturing a semiconductor device according to claim 9, wherein the forming an electrically conductive material is performed after the providing a groove portion.

11. The method of manufacturing a semiconductor device according to claim 6, wherein the providing a groove portion includes removing the coating film formed on the other main surface in a region in which the groove portion is to be provided, and by immersing the single lead frame in a chemical solution in a state where the coating film is removed, removing a portion of the single lead frame that overlaps with a region from which the coating film is removed, and by the removing a portion of the single lead frame, the single lead frame is partially removed such that a width of a region from which the single lead frame is removed is greater than a width of the region from which the coating film is removed, to provide the groove portion in which the second side surface partially bulges outward.

* * * * *